United States Patent [19]

Suzuki et al.

[11] Patent Number: 5,080,930

[45] Date of Patent: Jan. 14, 1992

[54] THERMAL CVD FOR THE PRODUCTION OF AN ELECTRODE COMPRISING A GRAPHITE COMPOSITION

[75] Inventors: Tomonari Suzuki, Kashihara; Hiroshi Wada, Nara; Yoshikazu Yoshimoto, Tenri; Masaru Yoshida; Shigeo Nakajima, both of Nara, all of Japan

[73] Assignee: Sharp Kabushiki Kaisha, Osaka, Japan

[21] Appl. No.: 580,608

[22] Filed: Sep. 11, 1990

Related U.S. Application Data

[62] Division of Ser. No. 362,505, Jun. 7, 1989, Pat. No. 4,978,600.

[30] Foreign Application Priority Data

Jun. 8, 1988 [JP] Japan .................. 63-141374

[51] Int. Cl.$^5$ .................. C23C 16/00; B05D 5/12
[52] U.S. Cl. .................. 427/122; 427/249; 427/248.1; 429/218
[58] Field of Search .................. 427/122, 248.1, 249; 429/218

[56] References Cited

U.S. PATENT DOCUMENTS

| | | | |
|---|---|---|---|
| 3,725,110 | 4/1973 | Rodgers et al. | 428/307.7 |
| 3,844,837 | 10/1974 | Bennion et al. | 204/2.1 |
| 4,048,953 | 9/1977 | Froberg | 118/49 |
| 4,264,686 | 4/1981 | Frank | 429/44 |
| 4,645,713 | 2/1987 | Shioya et al. | 428/457 |
| 4,707,423 | 11/1987 | Kainin et al. | 429/112 |
| 4,863,814 | 9/1989 | Mohri et al. | 429/60 |
| 4,863,818 | 9/1989 | Yoshimoto et al. | 429/218 |
| 4,968,527 | 11/1990 | Yoshimoto et al. | 427/122 |

FOREIGN PATENT DOCUMENTS

| | | |
|---|---|---|
| 0165047 | 12/1985 | European Pat. Off. . |
| 0201038 | 11/1986 | European Pat. Off. . |
| 0205856 | 12/1986 | European Pat. Off. . |
| 0239410 | 9/1987 | European Pat. Off. . |
| 0248386 | 12/1987 | European Pat. Off. . |
| 0249331 | 12/1987 | European Pat. Off. . |
| 0251677 | 1/1988 | European Pat. Off. . |
| 0273562 | 7/1988 | European Pat. Off. . |

OTHER PUBLICATIONS

Oya et al., "Review Phenomena of Catalytic Graphitization," *Journal of Materials Science 17*, (1982), pp. 309–322.

Chemical Abstracts 103: 25029z (1985).

*Primary Examiner*—Shrive Beck
*Assistant Examiner*—Roy V. King
*Attorney, Agent, or Firm*—Birch, Stewart, Kolasch & Birch

[57] ABSTRACT

A thermal CVD for the production of an electrode comprising a graphite composition as an active material is disclosed wherein the graphite composition is composed of high-crystalline graphite having interlayer spacings in the range of 0.3354 to 0.3400 nm and low-crystalline graphite having interlayer spacing in the range of 0.343 to 0.356 nm.

7 Claims, 2 Drawing Sheets

THERMAL CVD FOR THE PRODUCTION OF AN ELECTRODE COMPRISING A GRAPHITE COMPOSITION

This application is a divisional of copending application Ser. No. 07/362,505 filed on June 7, 1989, now U.S. Pat. No. 4,978,600.

BACKGROUND OF THE INVENTION

1. Field of the invention

This invention relates to an electrode and more particularly to an electrode for secondary batteries in which alkali metals such as lithium, potassium, or the like are used as a dopant. It also relates to a method for the production of such an electrode.

2. Description of the prior art

As an electrode for conventional secondary batteries in which alkali metals such as lithium, potassium, or the like are used as a dopant, the graphite electrode is well known in which a graphite material having an interlayer spacing of from 0.337 to 0.356 nm is used as an active material for the said electrode (U.S. Ser. No. 030,886 now U.S. Pat. No. 4,863,814).

The graphite material has a structure which is constituted of hexagonal net faces made of carbon atoms, which are spread and stacked over the entire region. In particular, when these hexagonal net faces are stacked in a quite regular manner, their interlayer spacing is equal to 0.3354 nm. When the hexagonal net faces are stacked in a less regular manner, their interlayer spacing increases gradually with increasing irregularity. The graphite material used for conventional electrodes has a distribution of interlayer spacings in the narrow region within the above-mentioned range.

However, such conventional electrodes are disadvantageous in that their electrochemically charging-discharging capacity is small, because the graphite material used as an active material has an interlayer spacing in the narrow region. In particular, the charging-discharging capacity at lower electric potentials, which becomes important when the electrode is combined with an appropriate positive electrode to form a battery, is small. Actually, the charging-discharging capacity at lower electric potentials in the range of 0 to +0.5 V based on that of a lithium reference electrode amounts to less than 180 mA.h per milligram of graphite material.

SUMMARY OF THE INVENTION

The electrode of this invention, which overcomes the above-discussed and numerous other disadvantages and deficiencies of the prior art, comprises a graphite composition as an active material, wherein the graphite composition is composed of high-crystalline graphite having interlayer spacings in the range of 0.3354 to 0.3400 nm and low-crystalline graphite having interlayer spacings in the range of 0.343 to 0.356 nm.

In a preferred embodiment, the graphite composition has the ratio of the diffraction intensity at $2\theta=25.0°$ to the diffraction intensity of the peak corresponding to the (002) reflection at $2\theta=26.3°$ in the X-ray diffraction profile ranging from 0.03 to 0.90.

In a preferred embodiment, the diffraction intensity ratio ranges from 0.03 to 0.50.

In a preferred embodiment, the graphite composition is directly deposited on an electrode substrate by chemical vapor deposition.

In a more preferred embodiment, the electrode substrate is made of iron, cobalt, nickel, or an alloy containing at least one of these metals.

In a preferred embodiment, the highcrystalline graphite mentioned above is carbon fibers heat-treated at high temperatures and the lowcrystalline graphite is pitch coke.

The method for the production of the electrode mentioned above, comprises disposing an electrode substrate within a reaction chamber for chemical vapor deposition, supplying a hydrocarbon compound as a starting material to the reaction chamber, thermally decomposing the hydrocarbon compound at a certain temperature to form a graphite composition, and directly depositing the graphite composition on the electrode substrate.

In a preferred embodiment, the hydrocarbon compound has a molecular weight equal to or less than 150.

In a preferred embodiment, the electrode substrate is made of iron, cobalt, nickel, or an alloy containing at least one of these metals.

In a preferred embodiment, the feed rate of the hydrocarbon compound is in the range of 0.05 to 15 mol/hr.

In a preferred embodiment, the number density of molecules of the hydrocarbon compound is in the range of $2.0 \times 10^{21}$ to $2.6 \times 10^{22}$ molecules/l.

In a preferred embodiment, the flow rate of the hydrocarbon compound is in the range of 0.5 to 70 cm/min.

In a preferred embodiment, the temperature is in the range of 450° to 1300° C.

In a more preferred embodiment, the temperature is in the range of 700° to 1200° C.

In a preferred embodiment, the coating of the graphite composition directly deposited on the electrode substrate has a thickness in the range of 1 to 300 μm.

Thus, the invention disclosed herein makes possible the objectives of (1) providing an electrode in which a graphite composition composed of high-crystalline graphite and low-crystalline graphite is used as an active material, so that the charging-discharging capacity at lower electric potentials is significantly increased in comparison with conventional electrodes having only one kind of a graphite material; (2) providing an electrode which can be combined with an appropriate counter electrode to produce a battery with the improved capacity and lifetime because of its large charging-discharging capacity at lower electric potentials; and (3) providing a method for the production of an electrode in which a graphite composition as an active material is directly deposited on an electrode substrate by chemical vapor deposition, so that the manufacturing processes can be simplified, thereby allowing a low production cost.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
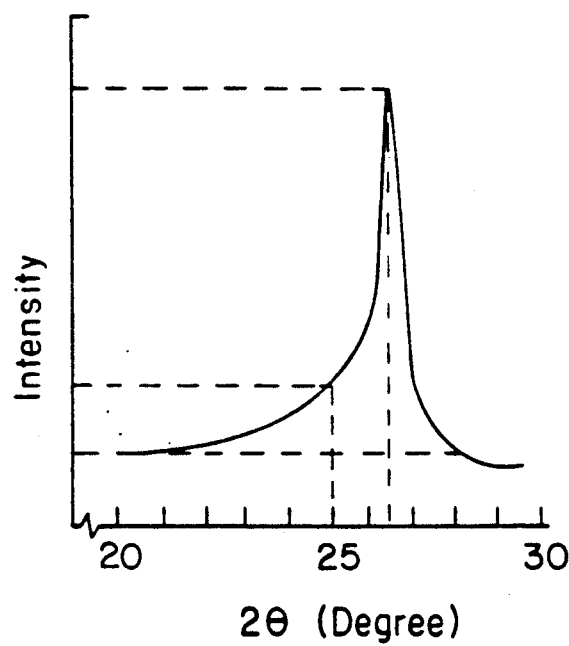
FIG. 1 is an X-ray diffraction profile with the CuK$_\alpha$ rays of the graphite composition of Example 1 of this invention.

The electrode of this invention comprises a graphite composition which is composed of graphite materials with different interlayer spacings as an active material. In this invention, the interlayer spacings are usually measured by X-ray diffraction and determined on the basis of the values of $2\theta$ corresponding to the respective diffraction peaks. As used herein, the interlayer spacings in the range of 0.3354 to 0.3400 nm is not necessarily intended to mean that the high-crystalline graphite has a distribution of interlayer spacings throughout this range. The high-crystalline graphite may contain at least one component having an interlayer spacing in this range. The same is true for the interlayer spacings in the range of 0.343 to 0.356 nm. The low-crystalline graphite may contain at least one component having an interlayer spacing in this range. For example, these graphite materials may have a continuous distribution of interlayer spacings over the respective ranges mentioned above, as observed in the X-ray diffraction profile.

In the measurement of the diffraction profile of the graphite composition by the use of an X-ray diffractometer with CuK$_\alpha$ rays, the ratio of the diffraction intensity at the diffraction angle $2\theta = 25°$ to the diffraction intensity of the peak corresponding to the (002) reflection of the graphite material having smaller interlayer spacings is in the range of 0.03 to 0.90, preferably 0.03 to 0.50. The ratios inside this range are desirable because the charging-discharging capacity at lower electric potentials in the range of 0 to +0.5 V based on that of a lithium reference electrode is increased by a factor of about 1.4 to 1.7 as compared with the conventional graphite electrodes. The ratios greater than 0.9 are undesirable because the proportion of low-crystalline graphite increases, so that the charging-discharging capacity is increased over a wide range of electric potentials including higher portions, whereas the flatness of charging-discharging curves becomes poor. The ratios less than 0.03 are also undesirable because the proportion of high-crystalline graphite increases, so that the flatness of charging-discharging curves is satisfactory, whereas the charging-discharging capacity decreases over a wide range of electric potentials including higher portions. In any case, the ratios outside the range mentioned above are further undesirable because of a decrease in the charging-discharging capacity at lower electric potentials. As mentioned above, to estimate the proportion of low-crystalline graphite to high-crystalline graphite, the diffraction intensity at $2\theta = 25.0°$ is used in place of the diffraction intensity of the peak corresponding to the (002) reflection of the graphite material having larger interlayer spacings. This is because the diffraction peaks corresponding to the (002) reflections of two kinds of graphite materials may, in some cases, be close to each other, making it difficult to distinguish therebetween.

In the case of a graphite material, it is well known that the interlayer spacing of the graphite is an excellent measure of the crystallinity of the graphite, and the half-height peak widths in the X-ray diffraction profile will actually decrease with decreasing the interlayer spacing of the graphite. Thus, the degree of crystallinity of the graphite can be adequately determined according to the magnitude of the interlayer spacing as mentioned above.

The graphite composition of this invention, which is composed of graphite materials with different interlayer spacings, can be prepared by any of various methods well known in the art. Of these methods, preferred is a method in which the graphite composition is directly deposited on an electrode substrate by chemical vapor deposition using a hydrocarbon compound as a starting material. Preferably, to form the graphite composition with high efficiency, the chemical vapor deposition is performed under the conditions:

(1) the feed rate of the hydrocarbon compound is in the range of 0.05 to 15 mol/hr;

(2) the number density of molecules of the hydrocarbon compound is in the range of $2.0 \times 10^{21}$ to $2.6 \times 10^{22}$ molecules/l;

(3) the flow rate of the hydrocarbon compound is in the range of 0.5 to 70 cm/min; and (4) the temperature for thermal decomposition is in the range of 450° to 1300° C., preferably 700° to 1200° C.

Under the conditions outside these ranges, it is difficult to form a graphite composition which is composed of graphite materials having the interlayer spacings mentioned above and more particularly to form a graphite composition which is composed of highcrystalline graphite and low-crystalline graphite at a proportion adequate to attain excellent electrode characteristics.

The starting material for the graphite composition is a hydrocarbon compound, which preferably has a molecular weight equal to or less than 150. The hydrocarbon compounds which can be used in this invention include aliphatic hydrocarbons, aromatic hydrocarbons, alicyclic hydrocarbons, and the like. Examples of these hydrocarbon compounds are benzene, toluene, xylene, naphthalene, anthracene, hexamethylbenzene, 1,2-dibromoethylene, 2-butyne, propane, acetylene, biphenyl, diphenylacetylene, and substitutional derivatives thereof.

The thickness of the coating of graphite composition directly deposited on the electrode substrate is suitably in the range of 1 to 300 μm.

The electrode substrate, which is preferably made of iron, cobalt, nickel, or an alloy containing at least one of these metals and employed in the abovementioned chemical vapor deposition, can be used as a current-collector of the graphite electrode because of its electric conductivity. Thus, according to this method, the preparation of the graphite composition as an active material and the formation of the graphite electrode can be conducted at a time, which is most preferable for practical use. The electrode substrate can be of any form such as that of a plate, foam, net, or the like.

The graphite composition of this invention can also be prepared by blending the low-crystalline graphite such as pitch coke and the high-crystalline graphite such as carbon fibers heat-treated at high temperature in a powder form, and then baking the blended mixture.

The electrode of this invention produced as mentioned above can be employed as an electrode for various batteries and preferably as a negative electrode for secondary batteries in which alkali metals are used as a dopant.

EXAMPLE 1

FIG. 1 shows an X-ray diffraction profile with the CuK$_{60}$ rays of a graphite composition of the electrode, which was prepared as follows: An electrode substrate made of nickel was disposed within the reaction chamber for chemical vapor deposition. When benzene was supplied as a starting material to the reaction chamber, the benzene was thermally decomposed within the reaction chamber to form the graphite composition, which was then directly deposited on the electrode substrate for growth, resulting in a graphite electrode. The coating of the graphite composition directly deposited on the electrode substrate had the thickness of 90 μm. The chemical vapor deposition mentioned above was performed under these conditions: the feed rate of benzene was 1.5 mol/hr; the number density of benzene molecules was $1.0 \times 10^{22}$ molecules/l, the flow rate of 1.5 cm/min, and the temperature for thermal decomposition was 950° C.

As can be seen from FIG. 1, the graphite composition obtained in this way was a mixture of highcrystalline graphite having the diffraction peak corresponding to the (002) reflection at $2\theta = 26.3°$ (corresponding to the interlayer spacing of 0.339 nm) and low-crystalline graphite having the diffraction peak at $2\theta = 25°$ (corresponding to the interlayer spacing of 0.356 nm). The ratio of the diffraction intensity of the low-crystalline graphite to the diffraction intensity of the high-crystalline graphite was 0.18.

Figure 2:
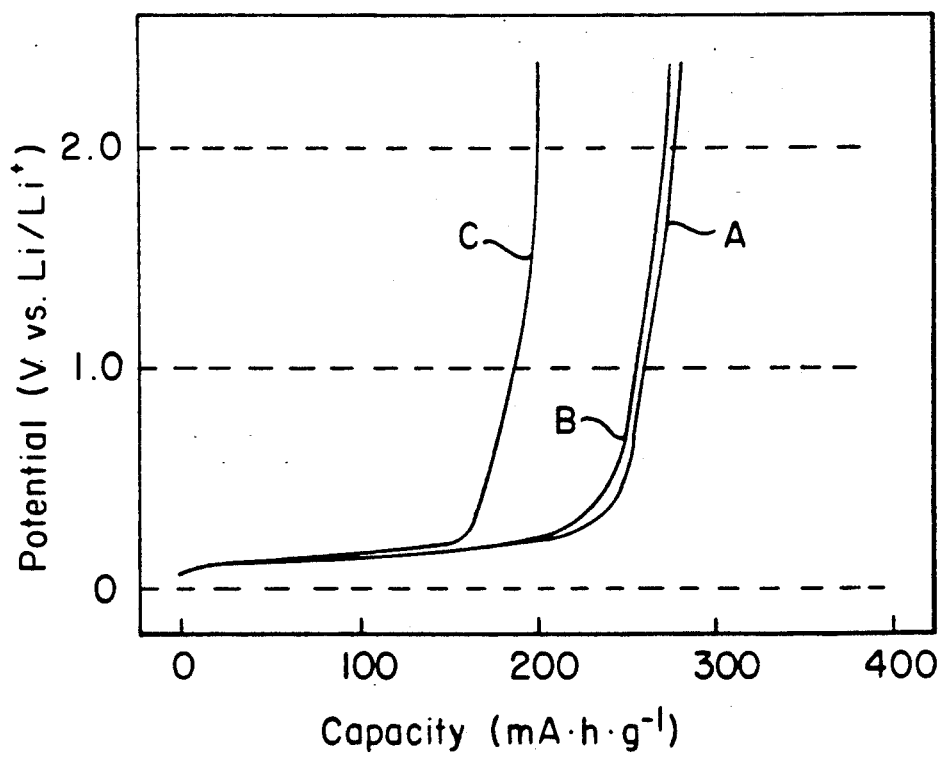
FIG. 2 shows charge-discharge characteristic curves of the graphite electrodes of Examples 1 and 2 of this invention and of the conventional graphite electrode of Comparative Example.

The graphite electrode obtained was used as a test sample electrode A. The test sample electrode A was immersed in an electrolytic bath, which was provided with lithium electrodes as a counter electrode and a reference electrode, and a charge-discharge test, in which the test sample electrode A was doped or dedoped with lithium atoms, was carried out. The electrolytic bath contained an electrolytic solution of propylene carbonate containing 1-M lithium perchlorate. The Curve A in FIG. 2 shows changes in the electric potential of the test sample electrode A based on that of the lithium reference electrode when the test sample electrode A was discharged, which clearly indicates that the discharging capacity of the graphite electrode of this example is much improved at electric potentials less than about 1 volt over the conventional graphite electrode of the comparative example below, and thus the discharging characteristics of the graphite electrode of this example are extremely satisfactory.

EXAMPLE 2

Figure 3:
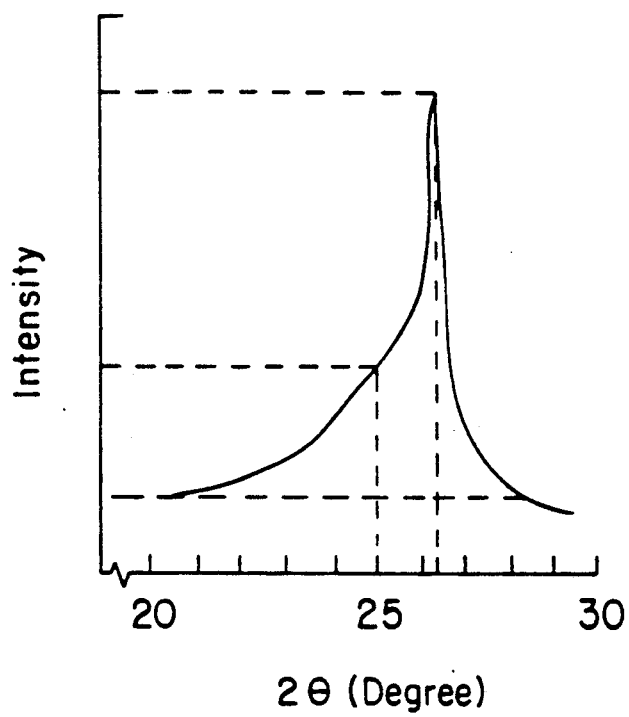
FIG. 3 is an X-ray diffraction profile with the CuK$_\alpha$ rays of the graphite composition of Example 2 of this invention.

FIG. 3 shows an X-ray diffraction profile with the CuK$_\alpha$ rays of a graphite composition of the electrode, which was prepared in the same manner as in Example 1, except that propane was used as the starting material and the chemical vapor deposition was performed under the conditions: the feed rate of propane was 2.2 mol/hr, the number density of propane molecules was $1.5 \times 10^2$ molecules/l, the flow rate of propane was 0.7 cm/min, and the temperature for thermal decomposition was 900° C.

As can be seen from FIG. 3, the graphite composition obtained in this way was a mixture of highcrystalline graphite and low-crystalline graphite. The ratio of the diffraction strength at $2\theta = 25.0°$ to the diffraction strength at $2\theta = 26.3°$ was 0.23.

The graphite electrode obtained was used as a test sample electrode B, and a charge-discharge test, in which the test sample electrode B was doped or dedoped with lithium atoms, was carried out in the same manner as in Example 1. The Curve B in FIG. 2 shows changes in the electric potential of the test sample electrode B based on that of the lithium reference electrode when the test sample electrode B was discharged, which clearly indicates that the discharging capacity of the graphite electrode of this example is very large at electric potentials less than about 1 volt, and thus the discharging characteristics of the graphite electrode of this example are extremely satisfactory.

COMPARATIVE EXAMPLE

Figure 4:
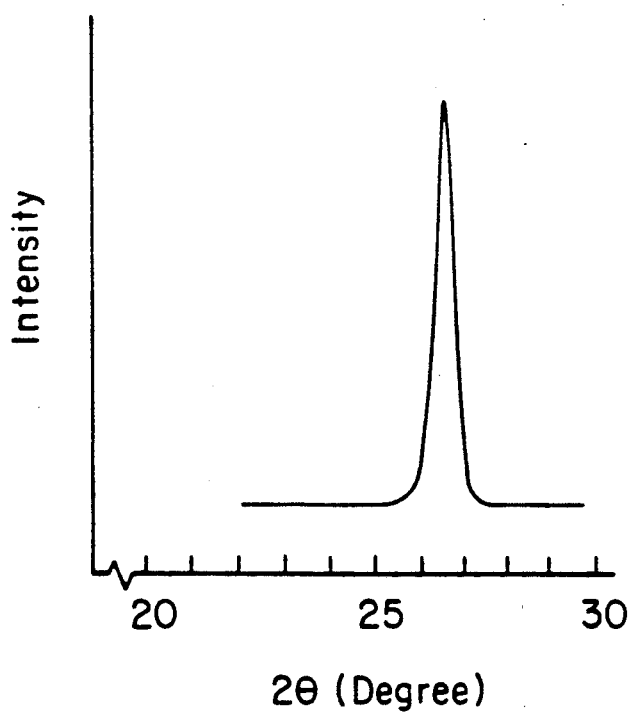
FIG. 4 is an X-ray diffraction profile with the CuK$_\alpha$ rays of the high-crystalline graphite of Comparative Example.

FIG. 4 shows an X-ray diffraction profile with the CuK$_\alpha$ rays of the graphite material of a conventional electrode. As can be seen from this figure, the graphite material was composed of only one high-crystalline graphite having the diffraction peak at $2\theta = 26.3°$ (corresponding to the interlayer spacing of 0.339 nm).

The conventional graphite electrode was used as a test sample electrode C, and a charge-discharge test, in which the test sample electrode C was doped or dedoped with lithium atoms, was carried out in the same manner as in Example 1. The Curve C in FIG. 2 shows changes in the electric potential of the test sample electrode C based on that of the lithium reference electrode when the test sample electrode C was discharged, which clearly indicates that compared to the graphite electrodes of the above-mentioned examples, the graphite electrode of this comparative example has a small discharging capacity at lower electric potentials and is not suitable for use as an electrode.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for the production of an electrode comprising a graphite composition as an active material, wherein said graphite composition is composed of high-crystalline graphite having interlayer spacings in the range of 0.3354 to 0.3400 nm and low-crystalline graphite having interlayer spacings in the range of 0.343 to 0.356 nm, wherein said method comprises the steps of:

disposing an electrode substrate within a reaction chamber for chemical vapor deposition, supplying a hydrocarbon compound as a starting material to said reaction chamber under the conditions that the feed rate of said hydrocarbon compound is in the range of 0.05 to 15 mol/hr, the number density of molecules of said hydrocarbon compound is in the range of $2.0 \times 10^{21}$ to $2.6 \times 10^{22}$ molecules/l, and the flow rate of said hydrocarbon is in the range of 0.5 to 70 cm/min., thermally decomposing said hydrocarbon compound at a temperature in the range of 450° to 1300° C. to form a graphite composition, and directly depositing said graphite composition on said electrode substrate to form said electrode.

2. A method for the production of an electrode according to claim 1, wherein said hydrocarbon compound has a molecular weight equal to or less than 150.

3. A method for the production of an electrode according to claim 1, wherein said electrode substrate is made of iron, cobalt, nickel, or an alloy containing at least one of these metals.

4. A method for the production of an electrode according to claim 1, wherein said temperature is in the range of 700° to 1200° C.

5. A method for the production of an electrode according to claim 1, wherein the coating of said graphite cmoposition directly deposited on said electrode substrate has a thickness in the range of 1 to 300 μm.

6. A method for the production of an electrode according to claim 1, wherein said hydrocarbon compound supplied as a starting material is selected from the group consisting of aliphatic hydrocarbons, aromatic hydrocarbons and alicyclic hydrocarbons.

7. A method for the production of an electrode according to claim 1, wherein said hydrocarbon compound supplied as a starting material is selected from the group consisting of benzene, toluene, xylene, naphthalene, anthracene, hexamethylbenzene, 1,2-dibromoethylene, 2-butyne, propane, acetylene, biphenyl, diphenylacetylene, and substituted derivatives thereof.

* * * * *